United States Patent

Davis

[15] 3,696,274

[45] Oct. 3, 1972

[54] AIR ISOLATED INTEGRATED CIRCUIT AND METHOD

[72] Inventor: Stanley Paul Davis, Cupertino, Calif.

[73] Assignee: Signetics Corporation, Sunnyvale, Calif.

[22] Filed: June 26, 1970

[21] Appl. No.: 50,168

[52] U.S. Cl. ....................317/235 R, 317/235 F
[51] Int. Cl. ....................H01l 19/00
[58] Field of Search.......317/235 F, 235 AJ, 235 AK, 317/101 A; 307/304; 330/38 M

[56] References Cited

UNITED STATES PATENTS

| | | | |
|---|---|---|---|
| 3,142,021 | 7/1964 | Stelmak | 317/235 |
| 3,486,892 | 12/1969 | Rosvold | 317/235 |

*Primary Examiner*—Jerry D. Craig
*Attorney*—Flehr, Hohbach, Test, Albritton & Herbert

[57] ABSTRACT

Air isolated integrated circuit having a support structure formed of an insulating material with a semiconductor body carried by the support structure, the body having a generally planar surface. The semiconductor body has moats formed therein in a pattern which extends into the semiconductor body so that there are provided a plurality of semiconductor islands. The moats are interrupted between at least certain of the islands so that bridges are formed between said certain islands. At least one semiconductor device is formed in each of the islands and metallization is provided which interconnects the semiconductor devices to form an integrated circuit. At least a portion of the metallization passes over the bridge between said certain islands.

In the method, moats are formed in a pattern in a semiconductor body to provide a plurality of semiconductor islands with the moats being interrupted between at least certain of the islands so that there is a bridge formed between said certain islands. Semiconductor devices can be formed in the semiconductor body either prior to or after the formation of the moats in the semiconductor body. Metallization is formed on the semiconductor body to interconnect the semiconductor devices with at least a portion of the metallization passing over the bridge between said certain islands.

4 Claims, 11 Drawing Figures

PATENTED OCT 3 1972 3,696,274

INVENTOR.
Stanley P. Davis
BY Flehr, Hohbach, Test, Albritton & Herbert
Attorneys

AIR ISOLATED INTEGRATED CIRCUIT AND METHOD

BACKGROUND OF THE INVENTION

Air isolated integrated circuits have heretofore been provided in which moats forming a pattern in the semiconductor body have formed isolated islands of semiconductor material in which the semiconductor devices are provided. Considerable difficulty has been encountered in forming the metallization pattern for interconnecting the semiconductor devices between the islands because the metallization must pass into and out of the moats in order to interconnect adjacent devices. Using conventional techniques, it has been found that it is difficult to properly delineate these metallization patterns particularly where they pass through the moats and the result is a frequent occurrence of open circuits in the metal pattern particularly where the metal pattern passes over a moat. There is, therefore, a need for a new and improved air isolated integrated circuit and a method for making the same.

SUMMARY OF THE INVENTION AND OBJECTS

The semiconductor integrated circuit consists of a support structure which is formed of an insulating material. A semiconductor body is carried by the support structure and has a generally planar surface. The semiconductor body has a plurality of moats formed therein to form a pattern. The moats extend into the semiconductor body so that they at least come into close proximity with the support structure whereby a plurality of islands of semiconductor material are provided. The moats between at least certain of the islands are interrupted so that a bridge is formed between said certain islands. At least one semiconductor device is formed in each of the islands and metallization is provided for interconnecting the semiconductor devices to form an integrated circuit. At least a portion of the metallization passes over the bridge.

In the method, a plurality of moats are formed in a semiconductor body to form a pattern so that the moats form a plurality of semiconductor islands. The moats between at least certain of the islands are being interrupted so that a bridge is formed between said certain islands. Semiconductor devices are formed in the semiconductor body either before or after the formation of the moats. Metallization is thereafter formed on the semiconductor body which is utilized for interconnecting the semiconductor devices with at least a portion of the metallization passing over the bridge.

In general, it is an object of the present invention to provide an air isolated integrated circuit and method in which it is possible to form metallization between the islands without danger of open circuits.

Another object of the invention is to provide an integrated circuit and method of the above character which makes it possible to reduce parasitic capacitance between adjacent device islands.

Another object of the invention is to provide a circuit and method of the above character which can be utilized in high performance circuits.

Another object of the invention is to provide a circuit and method of the above character which is highly controllable and reproducible.

Another object of the invention is to provide a circuit and method of the above character which eliminates metal interconnection delineation problems.

Additional objects and features of the invention will appear from the following description in which the preferred embodiments are set forth in detail in conjunction with the accompanying drawings.

DESCRIPTION OF THE PREFERRED EMBODIMENTS

FIGS. 1 – 11 show the method for fabricating an air isolated integrated circuit incorporating the present invention. In commencing the fabrication, a semiconductor body 16 formed of a suitable material such as silicon is provided. If desired, the silicon can be doped with an impurity such as an N-type impurity. In addition, it is desirable that the semiconductor body have a particular crystal orientation as, for example, a 100 crystal orientation so as to permit use of a particular selective etch as hereinafter described. A layer 18 of a suitable insulating material such as silicon dioxide is formed on the surface 17 of the semiconductor body 16. The silicon dioxide can be grown in a conventional manner such as by thermally growing the same in a furnace. A support layer 19 formed of a suitable material such as polycrystalline silicon is deposited on the oxide layer 18. The polycrystalline support layer is formed in a conventional manner and has a substantial thickness.

Figure 1:
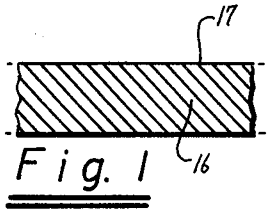
FIGS. 1 – 9 are greatly enlarged cross-sectional views showing the method utilized in the fabrication of the semiconductor integrated circuit.
Figure 2:
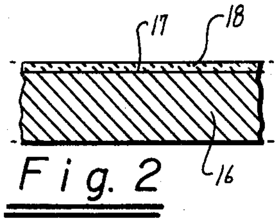
Figure 3:
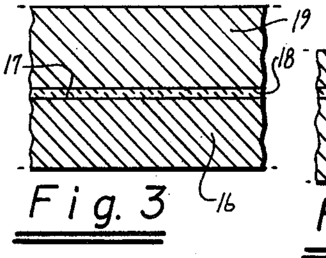
Figure 4:
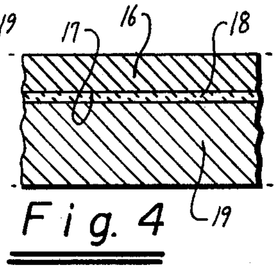
Figure 5:
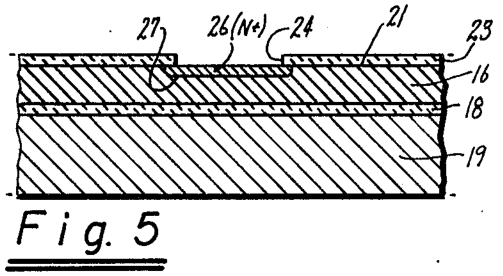
Figure 9:
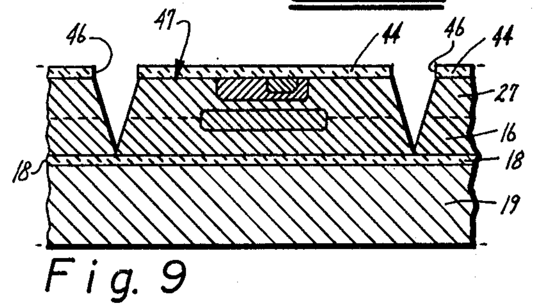

The structure which is shown in FIG. 3 is then taken and placed in a conventional lapping machine and a substantial portion of the semiconductor body 16 is removed so that there remains a semiconductor body 16 as shown in FIG. 4 and in which a new surface 21 is provided which is generally parallel with the surface 17. The surface 21 can be chemically polished. Alternatively, the material to be removed from the semiconductor body 16 can be removed by chemical etching. A layer 23 which is to serve as a mask is then grown on the surface 21. Typically, this layer can be formed of silicon dioxide. Utilizing conventional photolithographic techniques, an opening 24 is provided in the layer 23 by the use of a suitable selective etch. An N-type impurity such as arsenic is diffused through the opening 24 to provide a region 26 which extends downwardly into the semiconductor body 16 and which is defined by a dish-shaped P-N junction 27 that extends to the surface 21. As soon as the diffusion has been completed, the oxide layer 23 is removed by a suitable etch.

Figure 6:
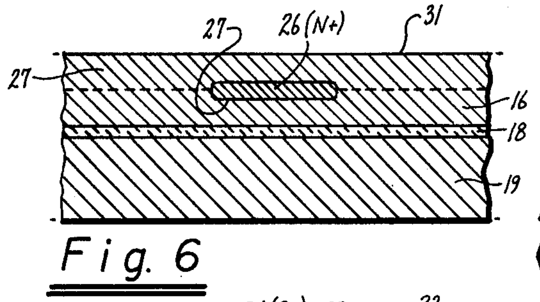
Figure 10:
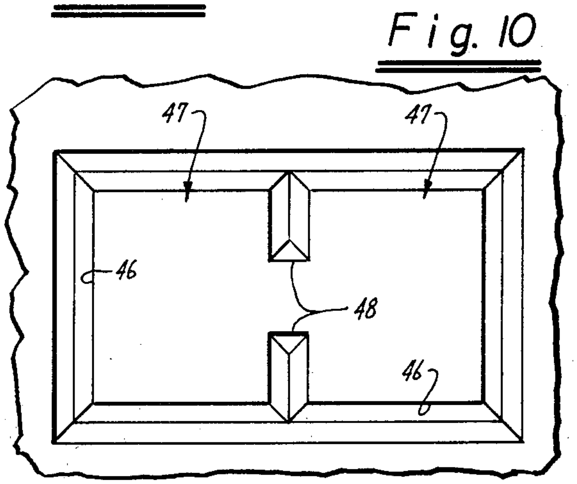
FIG. 10 is a plan view of the integrated circuit structure shown in FIG. 9.
Figure 7:
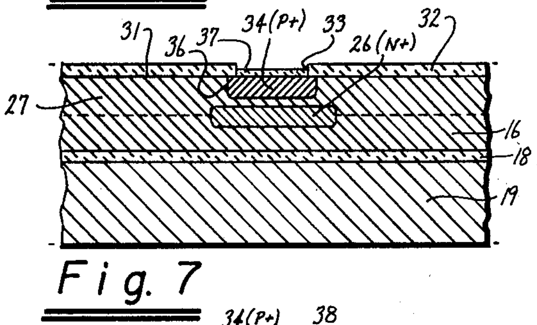
Figure 8:
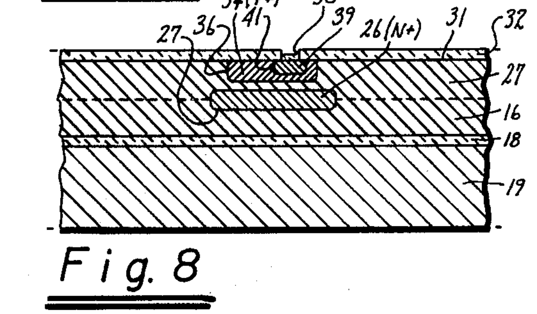

An additional thickness of material of the same general type as the semiconductor body 16 was formed is deposited on the surface 21. Typically, this also can be N-type material which is deposited in an epitaxial reactor so as to provide a combined layer of silicon which has a substantially uniform N-type impurity diffused throughout. The diffused region 26 takes the form of a buried layer as can be seen in FIG. 6. As described in copending application Ser. No. 38,754, filed May 19, 1970, and now abandoned by the use of two such layers, it is possible to provide a semiconductor body which has a relatively precise thickness and which has a planar surface 31.

A layer 32 which serves as a mask is formed on the surface 31. Typically, this layer also can be formed of silicon dioxide. An opening 33 is formed in the oxide in a conventional manner and a P-type impurity of a conventional type is diffused through the opening 33 to form a region 34 which extends into the semiconductor body in a direction towards the buried layer 26 and which is defined by a P-N junction which extends to the surface 31. During the time this diffusion takes place, a thin layer 37 of oxide grows within the opening 33. This region 34 can serve as a base region. The oxide layer 32 can be stripped and regrown if desired. Alternatively, an opening 38 can be formed in the oxide layer 37 and an N-type impurity is diffused through the opening 38 to form a region 39 within the region 34 and which is defined by a P-N junction 41 that extends to the surface 31.

It should be appreciated that although in the drawings, the forming of only one semiconductor device is shown, it is readily apparent that a plurality of semiconductor devices can be formed in the semiconductor body simultaneously. For example, both active and passive devices can be formed. In making passive devices such as resistors, the diffused resistors can be formed at the same time that the base region 34 is being diffused.

After all the diffusion steps have been completed, the oxide layer 32 can be stripped and another oxide layer 44 regrown.

Figure 11:
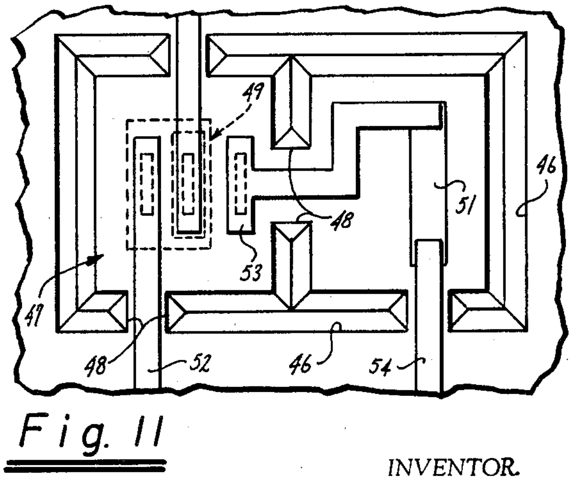
FIG. 11 is a plan view similar to FIG. 10 but showing the metallization in place which is utilized for making the interconnections between the semiconductor devices forming the integrated circuit.

A plurality of moats 46 are then formed by the use of conventional photolithographic techniques in which the exposed silicon dioxide is first removed by a selective etch, and thereafter an anisotropic etch is utilized to remove the silicon therebelow. It is desirable to utilize an anisotropic etch because it does not etch laterally as would be the case with other etches. The moats 46 have a width so that by the utilization of an anisotropic etch which follows the crystal orientation, the moats will be substantially V-shaped as shown in cross-section in FIG. 9 and preferably will extend downwardly completely through the semiconductor body to make contact with the intervening silicon dioxide layer 18. It is not absolutely necessary that the moats extend completely to the surface of the silicon dioxide layer 18 when maximum performance is not desired. The moats 46 are in a pattern and generally the pattern is such so that there is provided a plurality of semiconductor islands 47 each of which has a semiconductor device therein. The moats 46 forming at least certain of the islands are interrupted so that a bridge 48 is formed which extends between said certain islands. The bridge 48 has been formed of the silicon dioxide layer 44 and the semiconductor body 16 therebeneath. Thus, it can be seen that in forming the moats, the pattern of the moats is such so that a portion of the silicon dioxide layer 44 and the semiconductor body below it is not removed. As can be seen from FIGS. 10 and 11, a plurality of such bridges can be provided. In FIG. 11 there is shown a structure in which two separate islands 47 have been provided in which a transistor 49 is provided in one of the islands 47 and a diffused resistor 51 is formed in the other of the islands. Metallization is deposited over the silicon dioxide layer 44. Such metallization can take the form of aluminum which is evaporated onto the silicon dioxide layer 44. By the use of suitable photolithographic techniques, the undesired metallization is removed so that there remains a plurality of leads which are provided for interconnecting the semiconductor devices in the islands into an integrated circuit. Thus, there is provided a lead 52 which makes contact to the emitter region of the transistor 49. Similarly, there is provided a lead 53 which makes contact with the collector region of the transistor. This lead 53 extends over one of the bridges 48 and is connected to one end of the resistor 51. The other end of the resistor is connected to a lead 54 which extends through another of the bridges 48. The other parts of the integrated circuit are interconnected in the same manner so that there is provided a completely integrated circuit.

From the foregoing construction, it can be seen that there has been provided an integrated circuit which has relatively high density. This is possible because minimum spacing is utilized between the moats and the nearest component. The use of the anisotropic etch makes it possible to provide a well-defined moat which consumes a minimum of space. As pointed out previously, by properly choosing the width of the moat at the top, it is possible to ensure that the moat will etch all the way down to the intervening silicon dioxide layer 18. This is desirable in order to achieve maximum isolation between the devices forming the components of the integrated circuit. However, if by chance the moats should not go all the way down to the silicon dioxide layer but leave a very narrow layer of silicon between the bottom of the moat and the top of the intervening oxide layer, very little will be lost because such a silicon region will most likely be highly resistive and, therefore, will still provide excellent isolation. The small bridges of silicon with the layer of silicon dioxide on top of the same also do not significantly affect the isolation which is provided between the islands. The bridge typically has a width of 1-½ to two times as wide as the metallization that must be supported by the bridge. Typically, this could be a width ranging from one-half mil to 1 mil.

The air isolation between the islands containing the active and passive components of the integrated circuit serves to reduce parasitic capacitance between adjacent device islands.

In the foregoing method, the formation of the moats was performed after the active and passive devices had been formed. However, it should be appreciated that the moats may be formed at any desired step in the process. By way of example, the moats could be formed before any of the device diffusions have taken place. For example, they could be formed before the base diffusion shown in FIG. 7. Alternatively, if desired, they also could be formed after the base diffusion and prior to the emitter diffusion.

With the foregoing construction, it can be seen that there are many advantages. For example, in depositing the metallization by the utilization of the bridges, it is unnecessary that the metallization be deposited in any moats or the like. This greatly reduces the possibility of any open circuits and makes it possible to obtain high performance integrated circuits which can be reproduced on a controlled basis. Thus, it is possible to obtain excellent integrated circuits which have low parasitics because of air isolation.

Although the foregoing method has been described principally in conjunction with a silicon-over-oxide construction, it is readily apparent that, if desired, the method can be utilized with other constructions as, for example, an epitaxial structure in which resistive isolation is utilized rather than air isolation.

I claim:

1. In a semiconductor integrated circuit, a support structure formed of an insulating material, a body of semiconductor material carried by the support structure, said body having a generally planar surface, said body having a plurality of moats formed therein opening through said surface to form a pattern, the moats extending into the semiconductor body so that they at least are in close proximity to the support structure whereby a plurality of islands of semiconductor material are provided, said moats between at least certain of said islands being interrupted so that a bridge of the semiconductor material of the body integral with the body is formed between and interconnects said certain islands, at least one semiconductor device formed on each of said islands, an insulating layer disposed on the surfaces of said islands and on said bridge and metallization out of contact with said moats and disposed on said insulating layer interconnecting said semiconductor devices to form an integrated circuit, at least a portion of said metallization passing over said bridge and serving to interconnect at least portions of two of said semiconductor devices.

2. An integrated circuit as in claim 1 wherein said semiconductor body is formed of silicon, wherein said insulating layer is formed of silicon dioxide, and wherein said support structure includes a layer of silicon dioxide adjacent to said semiconductor body and a support layer adherent to said layer of silicon dioxide.

3. An integrated circuit as in claim 2 wherein said support layer is formed of polycrystalline silicon.

4. An integrated circuit as in claim 1 wherein said moats are generally V-shaped in cross-section.

* * * * *